United States Patent
Mieno

(10) Patent No.: US 7,887,884 B2
(45) Date of Patent: Feb. 15, 2011

(54) METHOD FOR ATOMIC LAYER DEPOSITION OF MATERIALS USING AN ATMOSPHERIC PRESSURE FOR SEMICONDUCTOR DEVICES

(75) Inventor: Fumitake Mieno, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 921 days.

(21) Appl. No.: 11/243,735

(22) Filed: Oct. 4, 2005

(65) Prior Publication Data

US 2007/0077356 A1    Apr. 5, 2007

(30) Foreign Application Priority Data

Sep. 20, 2005 (CN) .................. 2005 1 0029998

(51) Int. Cl.
C23C 16/00 (2006.01)
(52) U.S. Cl. .................. 427/249.1; 427/248.1
(58) Field of Classification Search ............... 427/248.1, 427/249.1
See application file for complete search history.

(56) References Cited

U.S. PATENT DOCUMENTS

| 5,156,521 A * | 10/1992 | Crabb et al. ............. 414/805 |
| 6,026,589 A * | 2/2000 | Yao et al. ............. 34/78 |
| 6,551,893 B1* | 4/2003 | Zheng et al. ............. 438/387 |
| 6,730,367 B2* | 5/2004 | Sandhu ............. 427/553 |
| 6,746,934 B2* | 6/2004 | Sandhu et al. ............. 438/428 |
| 7,220,312 B2* | 5/2007 | Doan et al. ............. 117/84 |

FOREIGN PATENT DOCUMENTS

| JP | 04288820 A | * 10/1992 |
| JP | 2003188171 A | * 7/2003 |
| JP | 2003324070 A | * 11/2003 |

* cited by examiner

*Primary Examiner*—Roberts Culbert
(74) *Attorney, Agent, or Firm*—Kilpatrick Townsend and Stockton LLP

(57) ABSTRACT

A method for atomic layer deposition. The method includes providing a substrate having a surface region and exposing the surface region of the substrate to an atmospheric pressure. The method also maintains at least the substrate at about the atmospheric pressure and forms a film overlying the surface region using atomic layer deposition, while the substrate is maintained at about atmospheric pressure. Preferably, the film is grown at a rate of greater than about 1 nanometer per minute.

23 Claims, 2 Drawing Sheets

Belt Speed; 10 cm/min.
Ar gas flow; 2 SLM
TMA flow; (bubbling Ar; 0.5 SLM at 25 Degree C
O3 Flow; 3 SLM (Ozone generator)
Wafer Temperature:; 450 Degree C

METHOD FOR ATOMIC LAYER DEPOSITION OF MATERIALS USING AN ATMOSPHERIC PRESSURE FOR SEMICONDUCTOR DEVICES

BACKGROUND OF THE INVENTION

The present invention is directed to integrated circuits and their processing for the manufacture of semiconductor devices. More particularly, the invention provides a method and structures for depositing one or more films of materials using atomic layer deposition under atmospheric conditions. Merely by way of example, the invention has been applied to the manufacture of advanced integrated circuit devices, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is formation of films using chemical vapor deposition techniques. These chemical vapor deposition techniques, commonly called CVD, often use precursor gases that are introduced using a plasma environment. The gases often form layers of materials, including insulation, semiconductor, and conductor. Although widely used in manufacturing of semiconductor devices, CVD techniques often lack good step coverage for smaller features. These smaller features are often less than about 0.2 µm and has an aspect ratio of 10, but can be others.

Accordingly, atomic layer deposition (ALD) techniques have been proposed. These techniques provide films will good step coverage over such smaller features. Unfortunately, ALD techniques have certain limitations. For example, ALD techniques are often slow and are difficult to implement for high volume manufacturing. These and other limitations may be found throughout the present specification and more particularly below.

From the above, it is seen that an improved technique for processing semiconductor devices is desired.

BRIEF SUMMARY OF THE INVENTION

According to the present invention, techniques directed to integrated circuits and their processing for the manufacture of semiconductor devices are provided. More particularly, the invention provides a method and structures for depositing one or more films of materials using atomic layer deposition under atmospheric conditions. Merely by way of example, the invention has been applied to the manufacture of advanced integrated circuit devices, but it would be recognized that the invention has a much broader range of applicability.

In a specific embodiment, the invention provides a method for forming a film using atomic layer deposition. The method includes placing a plurality of substrates into a cassette. The method also includes removing one of the substrates and applying the one substrate on a moving member, e.g., belt. The moving member is coupled to a plurality of gas distribution members, which are numbered from 1 through N, where N is an integer. The method also includes moving the substrate via moving member to expose a surface of the substrate to one or more of the gas distribution members in an serial manner from the first gas distribution member to the Nth gas distribution member. The method forms an atomic layer film overlying the surface as the surface moves on the moving member. Preferably, the one substrate is maintained at about atmospheric pressure while being subjected to one or more of the gas distribution members.

In an alternative specific embodiment, the invention provides a method for forming a film using atomic layer deposition under atmospheric conditions, e.g., 760 Torr. The method also includes placing a plurality of substrates into a cassette and removing one of the substrates. The method applies the one substrate on a moving member, which is coupled to a plurality of gas distribution members. The plurality of gas distribution members are numbered from 1 through N, where N is an integer. The method also moves the substrate via moving member to expose a surface of the substrate to one or more for the gas distribution members in an serial manner from the first gas distribution member to the Nth gas distribution member while maintaining the substrate at about an atmospheric pressure. The method forms an atomic layer film overlying the surface as the surface moves on the moving member while being maintained at atmospheric pressure.

In yet an alternative specific embodiment, the invention provides a method for atomic layer deposition. The method includes providing a substrate having a surface region and exposing the surface region of the substrate to an atmospheric pressure. The method also maintains at least the substrate at about the atmospheric pressure and forms a film overlying the surface region using atomic layer deposition, while the substrate is maintained at about atmospheric pressure. Preferably, the film is grown at a rate of greater than about 1 nanometer per minute.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 0.1 microns and less. Additionally, the invention can be applied to high volume manufacture of commercial devices. Depending upon the embodiment, one or more

DETAILED DESCRIPTION OF THE INVENTION

According to the present invention, techniques directed to integrated circuits and their processing for the manufacture of semiconductor devices are provided. More particularly, the invention provides a method and structures for depositing one or more films of materials using atomic layer deposition under atmospheric conditions. Merely by way of example, the invention has been applied to the manufacture of advanced integrated circuit devices, but it would be recognized that the invention has a much broader range of applicability.

Figure 1:
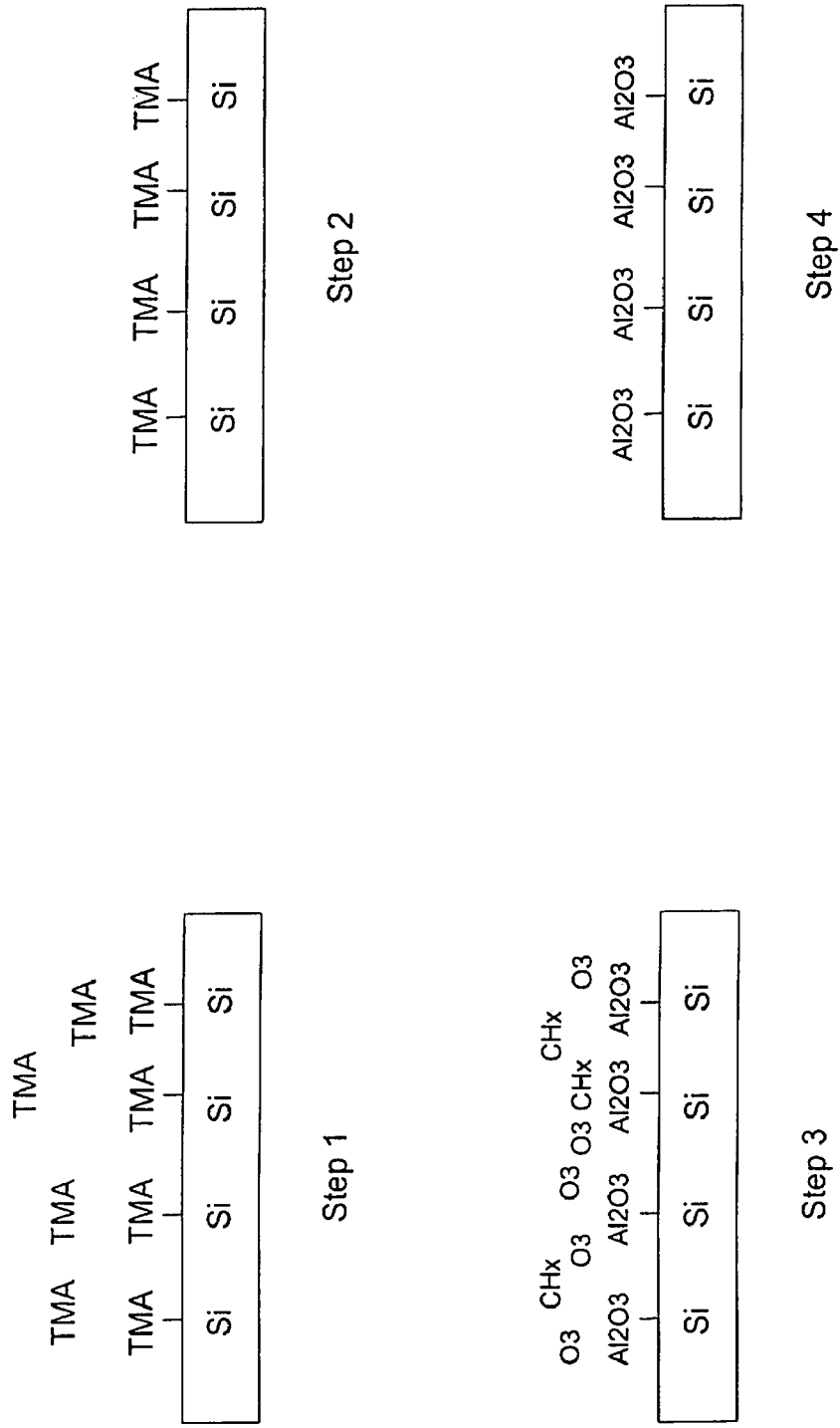
FIG. 1 is a simplified diagram illustrating a conventional method for atomic layer deposition.

FIG. 1 is a simplified diagram illustrating a conventional method for atomic layer deposition. As shown, there are four main processes or steps in conventional atomic layer deposition. Step 1 includes a silicon substrate treated with $Me_3Al$ (TMA). The TMA is the metal precursor made using chemisorption. The method purges the TMA as illustrated in step 2. The method reacts the TMA with ozone to form aluminum oxide ($Al_2O_3$), which is a monolayer. Ozone and carbon bearing species are purged via step 4. These steps take place under a vacuum environment to cause excess gas to be sourced out. Unfortunately, limitations exist with the conventional method. The deposition rate is often low and less than 1 nanometers per minute, which make the process undesirable for commercial high volume semiconductor production. These and other limitations that are overcome by the present invention may be found throughout the present specification and more particularly below.

A method for atomic layer deposition according to the present invention can be outlined as follows.

1. Place a plurality of substrates into a cassette and remove one of the substrates;
2. Apply the one substrate on a moving member, which is coupled to a plurality of gas distribution members, which are numbered from 1 through N, where N is an integer;
3. Move the substrate via moving member to expose a surface of the substrate to one or more for the gas distribution members in an serial manner from the first gas distribution member to the Nth gas distribution member while maintaining the substrate at about an atmospheric pressure;
4. Form an atomic layer film overlying the surface as the surface moves on the moving member while being maintained at atmospheric pressure; and
5. Perform other steps, as desired.

The above sequence of steps provides a method according to an embodiment of the present invention. As shown, the method uses a combination of steps including a way of forming a film using atomic layer deposition at atmospheric pressure. Preferably, the method occurs on a movable member, such as a belt or other drive coupled to a plurality of gas distribution members. Other alternatives can also be provided where steps are added, one or more steps are removed, or one or more steps are provided in a different sequence without departing from the scope of the claims herein. Details of using the above method for atomic layer deposition is provided below.

Figure 2:
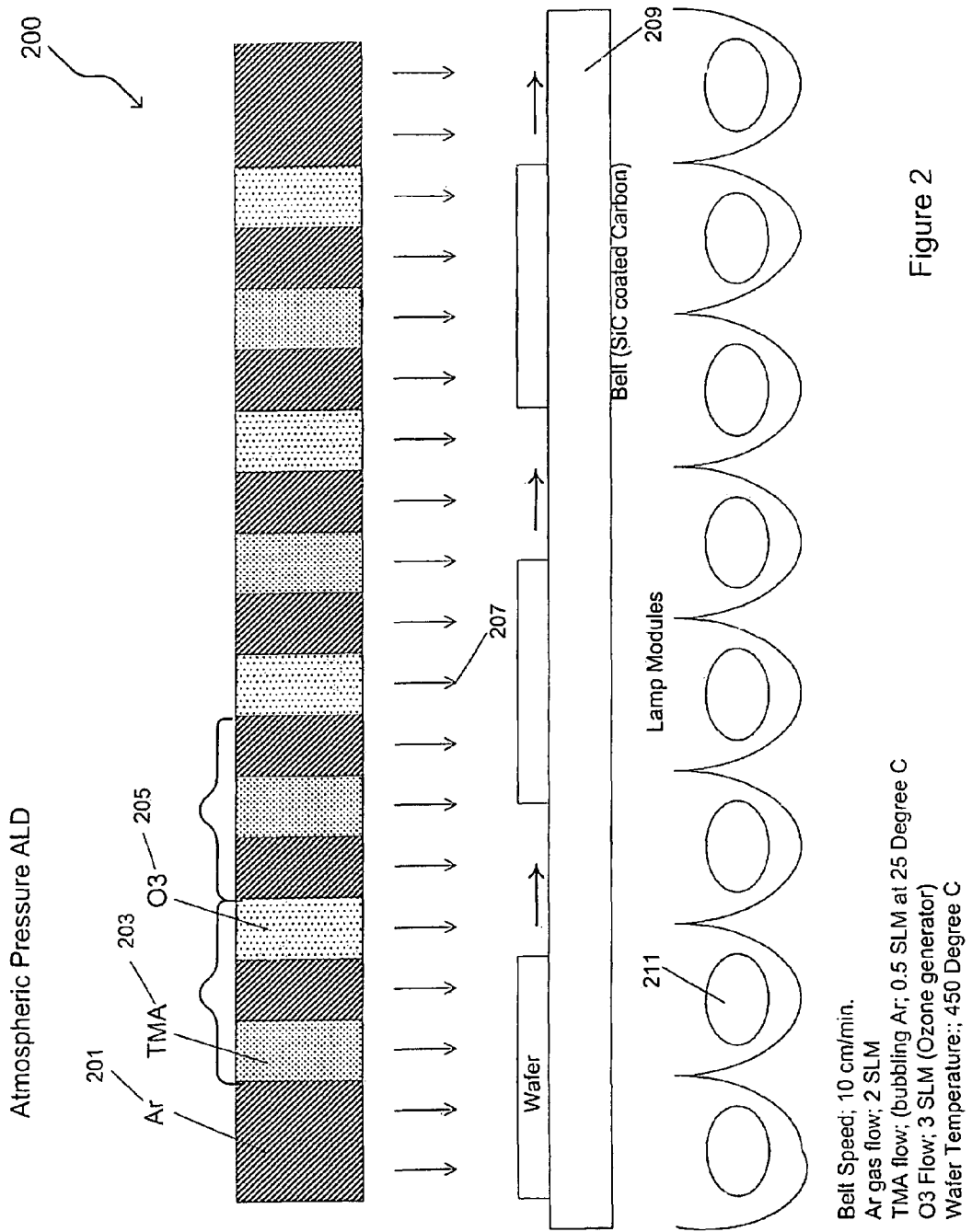
FIG. 2 illustrates a method for forming a layer using atomic layer deposition according to an embodiment of the present invention.

FIG. 2 is a simplified diagram 200 illustrating a method for forming a layer using atomic layer deposition according to an embodiment of the present invention. This diagram is merely an example, which should not unduly limit the scope of the claims herein. One of ordinary skill in the art would recognize many variations, alternatives, and modifications. As shown, the diagram includes a plurality of gas distribution members disposed overlying a movable member 209. The movable member allows wafers to be transported from a first location to a second location. The movable member is driven by a motor. Preferably, the movable member can be a silicon carbide coated carbon material. The movable member allows an upper surface of each of the wafers to be exposed to each of the gas distribution members. Each of the gas distribution members includes one or more openings to allow gas to pass therethrough in a laminar manner 207 in preferred embodiments.

Depending upon the application, each of the gas distribution members may have a different gas. For example, gas distribution member 201 may be for a purge gas. The purge gas may be inert. An example of such a purge gas is argon or other like species. Another gas distribution member is for TMA 203. Another gas distribution member after the TMA may be for purge gas again, which drives away excess TMA. Another gas distribution member may be for ozone or other like species. The members associated with argon, TMA, argon, and ozone may be grouped together to process the upper region in a serial manner. Another group of members associated with argon, TMA, argon, and ozone may be grouped together to process the upper region in a serial manner and is serial to yet another group of members including argon, TMA, argon, and ozone, as shown. Each group of argon, TMA, argon, ozone is for one cycle for the present method.

As merely an example, a certain process recipe may be outlined as follows:

Belt speed: 10 centimeters/minute;

TMA flow (bubbling argon: 0.5 Standard liters/minute (SLM) at 25 degrees Celsius);

$O_3$ flow: 3 SLM (from ozone generator); and

Temperature: 450 degrees Celsius.

The method uses a plurality of lamp modules 211 that are disposed along the backside of the movable member. Each of the lamp modules can correspond to a gas feeders. Preferably, the lamp module is controllable individually but can be others. The lamp modules can also be replaced with rapid thermal anneal modules or other like thermal application devices. Of course, one of ordinary skill in the art would recognize many variations, alternatives, and modifications.

In a specific embodiment, the invention provides a method for forming a film using atomic layer deposition. The method includes placing a plurality of substrates into a cassette. The method also includes removing one of the substrates and applying the one substrate on a moving member. The moving member is coupled to a plurality of gas distribution members, which are numbered from 1 through N, where N is an integer. The method also includes moving the substrate via moving member to expose a surface of the substrate to one or more for the gas distribution members in an serial manner from the first gas distribution member to the Nth gas distribution member. The method forms an atomic layer film overlying the surface as the surface moves on the moving member. Preferably, the one substrate is maintained at about atmospheric pressure while being subjected to one or more of the gas distribution members.

In an alternative specific embodiment, the invention provides a method for atomic layer deposition under atmospheric conditions, e.g., 760 Torr. The method also includes placing a plurality of substrates into a cassette and removing one of the substrates. The method applies the one substrate on a moving member, which is coupled to a plurality of gas distribution members. The plurality of gas distribution members are numbered from 1 through N, where N is an integer. The method also moves the substrate via moving member to expose a surface of the substrate to one or more for the gas distribution members in an serial manner from the first gas distribution member to the Nth gas distribution member while maintaining the substrate at about an atmospheric pressure. The method forms an atomic layer film overlying the surface as the surface moves on the moving member while being maintained at atmospheric pressure.

In yet an alternative specific embodiment, the invention provides a method for atomic layer deposition. The method includes providing a substrate having a surface region and exposing the surface region of the substrate to an atmospheric pressure. The method also maintains at least the substrate at about the atmospheric pressure and forms a film overlying the surface region using atomic layer deposition, while the substrate is maintained at about atmospheric pressure. Preferably, the film is grown at a rate of greater than about 1 nanometers per minute For low pressure LP-ALD batch case, deposition rate is about 3 Å/min. or ranges from 2 Å/min. to 5 Å/min.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for atomic layer deposition, the method comprising:
   placing a plurality of substrates into a cassette;
   removing one of the substrates;
   applying the one substrate on a moving member, the moving member being coupled to a plurality of gas distribution members numbered from 1 through N, where N is an integer;
   moving the substrate via the moving member to expose a surface of the substrate to one or more of the gas distribution members in a serial manner from the first gas distribution member to the Nth gas distribution member; and
   forming an atomic layer film overlying the surface as the surface moves on the moving member and is facing one or more of the plurality of gas distribution members,
   wherein the plurality of gas distribution members are provided in a plurality of groups numbered 1 through M, M being an integer greater than 1, each of the groups including a set of gas distribution members arranged in a same serial configuration numbered from 1 through N, and the substrate is moved from the first group to the Mth group via the moving member in a serial manner and in a first direction,
   wherein each of the plurality of groups comprises at least a reactant gas distribution member and an inert gas distribution member, and
   wherein the moving member comprises a silicon carbide coated carbon material.

2. The method of claim 1 wherein the exposed substrate is maintained at about atmospheric pressure.

3. The method of claim 1 wherein the moving member is a belt coupled to a rotatable device.

4. The method of claim 1 wherein the substrate is a semiconductor wafer or an LCD substrate.

5. The method of claim 1 wherein the exposed substrate is maintained at about atmospheric pressure as the one substrate traverses via the moving member.

6. The method of claim 1 wherein the atomic layer film is an AlO deposited using at least trimethyl aluminum (TMA) and ozone as reactant species.

7. The method of claim 1 wherein the atomic layer film is a semiconductor, a metal, and/or dielectrics.

8. The method of claim 6 wherein the substrate is maintained at a temperature of about 450 Degrees Celsius for deposition of the AlO film.

9. The method of claim 1 wherein the moving member is coupled to a plurality of lamp modules.

10. The method of claim 1 wherein the atomic layer film is defined by layer by layer deposited film.

11. A method for atomic layer deposition under atmospheric conditions, the method comprising:
    placing a plurality of substrates into a cassette;
    removing one of the substrates;
    applying the one substrate on a moving member, the moving member being coupled to a plurality of gas distribution members, the plurality of gas distribution members being numbered from 1 through N, where N is an integer;
    moving the substrate via the moving member to expose a surface of the substrate to one or more for the gas distribution members in an serial manner from the first gas distribution member to the Nth gas distribution member;
    maintaining the substrate at about an atmospheric pressure; and
    forming an atomic layer film overlying the surface as the surface moves on the moving member while being maintained at atmospheric pressure;
    wherein the plurality of gas distribution members are provided in a plurality of groups numbered 1 through M, M being an integer greater than 1, each of the groups including a same set of the gas distribution members arranged in a same serial configuration, and the substrate is moved from the first group to the Mth group via the moving member in a serial manner and in a first direction,
    wherein each of the plurality of groups comprises at least a reactant gas distribution member and an inert gas distribution member, and
    wherein the moving member comprises a silicon carbide coated carbon material.

12. The method of claim 11 wherein the substrate moves via the moving member at a rate of about 10 cm/min, to about 30 cm/min.

13. The method of claim 11 wherein the substrate is a semiconductor wafer or an LCD panel.

14. The method of claim 11 wherein the atomic layer film comprises AlO.

15. The method of claim 11 wherein one or more of the gas distribution members provide a precursor gas.

16. The method of claim 11 wherein one or more of the gas distribution members provide a purge gas.

17. The method of claim 16 wherein the nitridizer comprises N2H2.

18. The method of claim 16 wherein the purge gas is selected from argon or helium.

19. The method of claim 11 wherein one or more of the gas distribution members provide a nitridizer.

20. The method of claim 11 wherein one or more of the gas distribution members provide an oxidizer.

21. The method of claim 20 wherein the oxidizer is selected from ozone or H2O.

22. The method of claim 11 wherein the gas distribution members provide laminar flow over the exposed surface of the substrate.

23. A method for atomic layer deposition, the method comprising:

providing a substrate having a surface region;

exposing the surface region of the substrate to an atmospheric pressure;

maintaining the substrate at about the atmospheric pressure; and forming a film overlying the surface region using atomic layer deposition, while the substrate is maintained at about atmospheric pressure to enhance a deposition rate of the film to more than 1 nanometers per minute, wherein the atomic layer deposition is provided by applying the substrate on a moving member, the substrate being exposed to a plurality of gas distribution members, the plurality of gas distribution members being arranged in a serial manner numbered from 1 through N, where N is an integer, the plurality of gas distribution members are provided in a plurality of groups numbered 1 through M, M being an integer greater than one, each of the groups includes a same set of gas distribution members arranged in a same serial manner, and the substrate is moved from the first group to the Mth group in a first direction via the moving member in a serial manner, wherein each group comprises an argon distribution member, a $Me_3Al$ (TMA) a distribution member, and another argon distribution member.

* * * * *